United States Patent
Nakayama et al.

(10) Patent No.: US 10,000,842 B2
(45) Date of Patent: Jun. 19, 2018

(54) OXIDE SINTERED BODY, SPUTTERING TARGET, AND OXIDE SEMICONDUCTOR THIN FILM OBTAINED USING SPUTTERING TARGET

(71) Applicant: SUMITOMO METAL MINING CO., LTD., Tokyo (JP)

(72) Inventors: Tokuyuki Nakayama, Ome (JP); Eiichiro Nishimura, Ome (JP); Fumihiko Matsumura, Ome (JP); Masashi Iwara, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days. days.

(21) Appl. No.: 15/319,578

(22) PCT Filed: Jun. 24, 2015

(86) PCT No.: PCT/JP2015/068159
§ 371 (c)(1),
(2) Date: Dec. 16, 2016

(87) PCT Pub. No.: WO2015/199121
PCT Pub. Date: Dec. 30, 2015

(65) Prior Publication Data
US 2017/0130329 A1    May 11, 2017

(30) Foreign Application Priority Data
Jun. 26, 2014  (JP) .................. 2014-131838

(51) Int. Cl.
H01L 21/02 (2006.01)
C23C 14/34 (2006.01)
C04B 35/01 (2006.01)
C04B 35/64 (2006.01)
C04B 35/622 (2006.01)
H01L 29/786 (2006.01)
H01L 29/22 (2006.01)
H01L 29/24 (2006.01)
H01L 21/465 (2006.01)
H01J 37/34 (2006.01)
C23C 14/08 (2006.01)

(52) U.S. Cl.
CPC .......... *C23C 14/3414* (2013.01); *C04B 35/01* (2013.01); *C04B 35/62218* (2013.01); *C04B 35/64* (2013.01); *C23C 14/086* (2013.01); *H01J 37/3426* (2013.01); *H01L 21/02483* (2013.01); *H01L 21/02554* (2013.01); *H01L 21/02565* (2013.01); *H01L 21/02592* (2013.01); *H01L 21/02631* (2013.01); *H01L 21/465* (2013.01); *H01L 29/2206* (2013.01); *H01L 29/247* (2013.01); *H01L 29/78693* (2013.01); *C04B 2235/3208* (2013.01); *C04B 2235/3213* (2013.01); *C04B 2235/3275* (2013.01); *C04B 2235/3279* (2013.01); *C04B 2235/3286* (2013.01); *C04B 2235/3296* (2013.01); *C04B 2235/96* (2013.01); *H01L 29/245* (2013.01)

(58) Field of Classification Search
CPC ......... H01L 21/02365; H01L 21/02436; H01L 21/02469; H01L 21/02496; H01L 21/02518
See application file for complete search history.

(56) References Cited

U.S. PATENT DOCUMENTS

| | | | |
|---|---|---|---|
| 2004/0180217 | A1 | 9/2004 | Inoue |
| 2011/0180763 | A1 | 7/2011 | Utsuno |
| 2011/0260157 | A1 | 10/2011 | Yano |
| 2012/0012838 | A1 | 1/2012 | Hosono |
| 2012/0168748 | A1 | 7/2012 | Yano |
| 2012/0256179 | A1 | 10/2012 | Yamazaki |

FOREIGN PATENT DOCUMENTS

| | | | |
|---|---|---|---|
| JP | 2007-302508 | A1 | 11/2007 |
| JP | 2010-219538 | A1 | 9/2010 |
| JP | 2012-216863 | A1 | 11/2012 |
| JP | 2012-253372 | A1 | 12/2012 |
| TW | 201014812 | A1 | 4/2010 |
| WO | 03/014409 | A1 | 2/2003 |
| WO | 2008/117739 | A1 | 10/2008 |
| WO | 2010/032422 | A1 | 3/2010 |

OTHER PUBLICATIONS

U.S. Appl. No. 15/319,569 by Tokuyuki Nakayama, et al., filed on Dec. 16, 2016 (43 Pages).

(Continued)

*Primary Examiner* — Cheung Lee
(74) *Attorney, Agent, or Firm* — Kratz, Quintos & Hanson, LLP

(57) ABSTRACT

Provided is an oxide sintered body that, when used to obtain an oxide semiconductor thin film by sputtering, can achieve a low carrier concentration and a high carrier mobility. Also provided is a sputtering target using the oxide sintered body. The oxide sintered body contains, as oxides, indium, gallium, and at least one positive divalent element selected from the group consisting of nickel, cobalt, calcium, strontium, and lead. The gallium content, in terms of the atomic ratio Ga/(In+Ga), is from 0.20 to 0.45, and the positive divalent element content, in terms of the atomic ratio M/(In+Ga+M), is from 0.0001 to 0.05. The amorphous oxide semiconductor thin film, which is formed using the oxide sintered body as a sputtering target, can achieve a carrier concentration of less than $3.0 \times 10^{18}$ cm$^{-3}$ and a carrier mobility of at least 10 cm$^2$V$^{-1}$ sec$^{-1}$.

5 Claims, No Drawings

(56) References Cited

OTHER PUBLICATIONS

A. Takagi, et al.; "Carrier transport and electronic structure in amorphous oxide semiconductor, a-InGaZnO4;" Thin Solid Films; vol. 486; 2005; pp. 38-41 (4 Sheets)/p. 4 of specification.
Office Action issued to TW Application No. 104120448, dated Mar. 1, 2016 (5 Sheets).
International Search Report for International Application No. PCT/JP2015/068159 dated Aug. 18, 2015.

US 10,000,842 B2

OXIDE SINTERED BODY, SPUTTERING TARGET, AND OXIDE SEMICONDUCTOR THIN FILM OBTAINED USING SPUTTERING TARGET

TECHNICAL FIELD

The present invention relates to an oxide sintered body, a target, and an oxide semiconductor thin film obtained by using the target, and more particularly to an amorphous oxide semiconductor thin film which has low carrier density and high carrier mobility and contains indium, gallium, and a positive divalent element (one or more positive divalent elements selected from the group consisting of nickel, cobalt, calcium, strontium, and lead), a sputtering target that is suitable for the formation of the amorphous oxide semiconductor thin film and contains Indium, gallium, and a positive divalent element (one or more positive divalent elements selected from the group consisting of nickel, cobalt, calcium, strontium, and lead), and an oxide sintered body that is suitable for obtaining the sputtering target and contains indium, gallium, and a positive divalent element (one or more positive divalent elements selected from the group consisting of nickel, cobalt, calcium, strontium, and lead).

BACKGROUND ART

Thin film transistors (TFTs) are a type of field effect transistors (hereinafter referred to as FETs).

TFTs are three-terminal elements having a gate terminal, a source terminal, and a drain terminal in the basic structure. TFTs are active elements having a function of switching the current between the source terminal and the drain terminal so that a semiconductor thin film deposited on a substrate is used as a channel layer in which electrons or holes move and a voltage is applied to the gate terminal to control the current flowing in the channel layer. TFTs are electronic devices that are most widely used these days in practical application. Typical applications of TFTs include liquid-crystal driving elements.

Currently, most widely used TFTs are metal-insulator-semiconductor-FETs (MIS-FETs) in which a polycrystalline silicon film or an amorphous silicon film is used as a channel layer material. MIS-FETs including silicon are opaque to visible light and thus fail to form transparent circuits. Therefore, when MIS-FETs are used as switching elements for driving liquid crystals in liquid crystal displays, the aperture ratio of a display pixel in the devices is small.

Due to the recent need for high-resolution liquid crystals, switching elements for driving liquid crystals now require high-speed driving. In order to achieve high-speed driving, a semiconductor thin film in which the mobility of electrons or holes, is higher than that in at least amorphous silicon needs to be used as a channel layer.

Under such circumstances, Patent Document 1 proposes a transparent semi-insulating amorphous oxide thin film which is a transparent amorphous oxide thin film deposited by vapor deposition and containing elements of In, Ga, Zn, and O. The composition of the oxide is $InGaO_3(ZnO)_m$ (m is a natural number less than 6) when the oxide is crystallized. The transparent semi-insulating amorphous oxide thin film is a semi-insulating thin film having a carrier mobility (also referred to as carrier electron mobility) of more than 1 $cm^2$ $V^{-1}$ $sec^{-1}$ and a carrier density (also referred to as carrier electron density) of $10^{16}$ $cm^{-3}$ or less without doping with an impurity ion. Patent Document 1 also proposes a thin film transistor in which the transparent semi-insulating amorphous oxide thin film is used as a channel layer.

However, as proposed in Patent Document 1, the transparent amorphous oxide thin film (a-IGZO film) containing elements of In, Ga, Zn, and O and deposited by any method of vapor deposition selected from sputtering and pulsed laser deposition has an electron carrier mobility in the range of only about from 1 to 10 $cm^2$ $V^{-1}$ $sec^{-1}$. It is pointed out that this carrier mobility is insufficient when this transparent amorphous oxide thin film is formed as a channel layer in TFTs.

In addition, Patent Document 2 proposes a semiconductor device using a polycrystalline oxide semiconductor thin film which contains In and two or more kinds of metal other than In and has an electron carrier density of less than $1\times10^{18}$ $cm^3$. It is described that the two or more kinds of metal other than In are the positive divalent metal and the positive trivalent metal in claim 6 of Patent Document 2 and the positive divalent metal is at least one element selected from Zn, Mg, Cu, Ni, Co, Ca, and Sr and the positive trivalent metal is at least one element selected from Ga, Al, B, La, Ce, Pr, Nd, Sm, Eu, Gd, Tb, Dy, Ho, Er, Tm, Yb, and Lu in claim 7 of Patent Document 2.

However, in Patent Document 2, Examples for the combination of Ga and at least one element selected from Ni, Co, Ca, and Sr are not described. In addition, the hole mobility is as low as less than 10 $cm^2$ $V^{-1}$ $sec^{-1}$ in Examples for combinations other than the combination of these. Furthermore, it is not instigated which sintered body structure is preferable for an oxide sintered body to be used in sputter deposition of an oxide semiconductor thin film so as to avoid the occurrence of arcing and nodules. In addition, the sputter deposition is performed by high frequency (RF) sputtering, and it is also not clear whether the sputtering target can be subjected to direct current (DC) sputtering or not.

Patent Document 1: Japanese Unexamined Patent Application, Publication No. 2010-219538

Patent Document 2: PCT International Publication No. WO2008/117739

Patent Document 3: PCT International Publication No. WO2003/014409

Patent Document 4: Japanese Unexamined Patent Application, Publication No. 2012-253372

Non Patent Document 1: A. Takagi, K. Nomura, H. Ohta, H. Yanagi, T. Kamiya, M. Hirano, and H. Hosono, Thin Solid Films 486, 38 (2005)

DISCLOSURE OF THE INVENTION

Problems to be Solved by the Invention

An object of the present invention is to provide a sputtering target that allows an amorphous oxide semiconductor thin film to have low carrier density, an oxide sintered body most suitable for obtaining the sputtering target, and an oxide semiconductor thin film that is obtained by using the sputtering target and has low carrier density and high carrier mobility.

Means for Solving the Problems

The present inventors have newly found out that an oxide sintered body that has been sintered is composed substantially of an $In_2O_3$ phase having a bixbyite-type structure and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase. And an oxide semiconductor thin film produced using the oxide sintered body has a carrier mobility of 10 $cm^2$ $V^{-1}$ $sec^{-1}$ or more when a small amount of one or more positive divalent elements M selected from the group consisting of nickel, cobalt, calcium, strontium, and lead, specifically at a ratio of 0.0001 or more and 0.05 or less in terms of the ratio of M/(In+Ga+M) is contained particularly in an oxide sintered body containing gallium as an oxide at a ratio of 0.20 or more and 0.45 or less in terms of the ratio of gallium to indium, Ga/(In+Ga).

That is, in the first embodiment of the present invention, the oxide sintered body includes indium, gallium, and a positive divalent element as oxides. The gallium content is 0.20 or more and 0.45 or less in terms of Ga/(In+Ga) atomic ratio. The total content of all the positive divalent elements is 0.0001 or more and 0.05 or less in terms of M/(In+Ga+M) atomic ratio. The positive divalent element is one or more selected from the group consisting of nickel, cobalt, calcium, strontium, and lead. The oxide sintered body is composed of an $In_2O_3$ phase having a bixbyite-type structure; and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase. The oxide sintered body is substantially free of a $NiGa_2O_4$ phase, a $CoGa_2O_4$ phase, a $CaGa_4O_7$ phase, a $Ca_5Ga_6O_{14}$ phase, a $SrGa_{12}O_{19}$ phase, a $SrGa_2O_4$ phase, a $Sr_3Ga_2O_6$ phase, and a $Ga_1PbO_4$ phase that are a complex oxide composed of the positive divalent element and gallium or a complex oxide phase of these.

In a second embodiment of the present invention, the total content of all the positive divalent elements is 0.0001 or more and 0.03 or less in terms of M/(In+Ga+M) atomic ratio in the oxide sintered body according to the first embodiment.

In a third embodiment of the present invention, the gallium content is 0.20 or more and 0.30 or less in terms of Ga/(In+Ga) atomic ratio in the oxide sintered body according to the first or second embodiment.

In a fourth embodiment of the present invention, the oxide sintered body according to any one of the first to third embodiments is substantially free of positive divalent elements other than the positive divalent elements and positive trivalent to positive hexavalent elements other than indium and gallium.

In a fifth embodiment of the present invention, the X-ray diffraction peak intensity ratio of the $GaInO_3$ phase having a $\beta$-$Ga_2O_3$-type structure defined by formula 1 below is in the range of from 29% or more to 75% or less in the oxide sintered body according to any one of the first to fourth embodiments.

100×I[GaInO₃ phase(111)]/{I[In₂O₃ phase(400)]+I[GaInO₃ phase(111)]}[%]  Formula 1

In a sixth embodiment of the present invention, a sputtering target is obtained by machining the oxide sintered body according to any one of the first to fifth embodiments.

In a seventh embodiment of the present invention, an amorphous oxide semiconductor thin film that is obtained by film deposition on a substrate by using the sputtering target according to the sixth embodiment by sputtering, followed by heating.

In an eighth embodiment of the present invention, the oxide semiconductor thin film according to the seventh embodiment has a carrier mobility of 10 $cm^2$ $V^{-1}$ $sec^{-1}$ or more.

In a ninth embodiment of the present invention, the oxide semiconductor thin film according to the seventh or eighth embodiment has a carrier density of less than $3.0 \times 10^{18}$ $cm^{-3}$.

Effects of the Invention

The oxide sintered body of the present invention which contains indium and gallium as oxides and the positive divalent element M at 0.0001 or more and 0.05 or less in terms of M/(In +Ga+M) atomic ratio can provide the amorphous oxide semiconductor thin film of the present invention that is obtained by depositing a film by sputtering and then subjecting the film to a heat treatment, for example, when being used as a sputtering target. Since the amorphous oxide semiconductor thin film is free of microcrystals and the like and has sufficient amorphous properties because of the effect of predetermined amounts of gallium in the thin film, the thin film can be patterned into a desired shape by wet etching. This effect also allows the amorphous oxide semiconductor thin film of the present invention to have a low carrier density and a high carrier mobility. The amorphous oxide semiconductor thin film of the present invention can thus be used as a channel layer in TFTs. Therefore, the oxide sintered body, target and the oxide semiconductor thin film obtained by using the target according to the present invention are industrially very useful.

PREFERRED MODE FOR CARRYING OUT THE INVENTION

An oxide sintered body, a sputtering target, and an oxide semiconductor thin film obtained by using the target in the present invention will be described below in detail.

The oxide sintered body of the present invention contains Indium, gallium, and a positive divalent element M. In the oxide sintered body, the gallium content is 0.20 or more and 0.45 or less in terms of Ga/(In+Ga) atomic ratio, the concentration of the positive divalent element M is 0.0001 or more and 0.05 or less in terms of M/(In+Ga+M) atomic ratio, and the divalent element M is one or more elements selected from the group consisting of nickel, cobalt, calcium, strontium, and lead.

The gallium content, in terms of Ga/(In+Ga) atomic ratio, is 0.20 or more and 0.45 or less and more preferably 0.20 or more and 0.30 or less. Gallium also has an effect of reducing the oxygen loss in the amorphous oxide semiconductor thin film of the present invention because gallium has a high bonding strength with oxygen. When the gallium content is less than 0.20 in terms of Ga/(In+Ga) atomic ratio, this effect is not sufficiently obtained. On the other hand, when the gallium content is more than 0.45 in terms of Ga/(In+Ga) atomic ratio, the carrier mobility is not high enough as an oxide semiconductor thin film.

The oxide sintered body of the present invention contains the positive divalent element M in addition to indium and gallium in the composition ranges defined above. The concentration of the positive divalent element M, in terms of M/(In+Ga+M) atomic ratio, is 0.0001 or more and 0.05 or less and preferably 0.0001 or more and 0.03 or less.

Doping the oxide sintered body of the present invention with the positive divalent element M in this range reduces the carrier density because the positive divalent element M has an effect of neutralizing electrons generated mainly by oxygen defects. When the amorphous oxide semiconductor thin film of the present invention is used in TFTs, the on/off ratio of TFTs can be increased.

It is preferred that the oxide sintered body of the present invention is substantially free of elements M', which are positive divalent elements other than the positive divalent element M and positive trivalent to positive hexavalent elements other than indium and gallium. The term "substantially free of" as used herein means that the content of each element M', in terms of M'/(In+Ga+M') atomic ratio, is 500 ppm or less, preferably 200 ppm or less, and more preferably 100 ppm or less. Specific examples of the element M' include positive divalent elements, such as Cu, Mg, and Zn; positive trivalent elements, such as Al, Y, Sc, B, and lanthanoids; positive tetravalent elements, such as Sn, Ge, Ti, Si, Zr, Hf, C, and Ce; positive pentavalent elements, such as Nb and Ta; and positive hexavalent elements, such as W and Mo.

1. Structure of Oxide Sintered Body

It is preferred that the oxide sintered body of the present invention is composed of an $In_2O_3$ phase having a bixbyite-type structure; and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase. When the oxide sintered body of the present invention is composed only of an $In_2O_3$ phase, nodules are generated, for example, as in Comparative Example 11 of Patent Document 3 (WO2003/014409 A) regardless of the presence of the positive divalent element M. On the other hand, a $NiGa_2O_4$ phase, a $CoGa_2O_4$ phase, a $CaGa_4O_7$ phase, a $Ca_5Ga_6O_{14}$ phase, a $SrGa_{12}O_{19}$ phase, a $SrGa_2O_4$ phase, a $Sr_3Ga_2O_6$ phase, and a $Ga_2PbO_4$ phase described above or a complex oxide phase of these have a higher electrical resistance value as compared to the $In_2O_3$ phase or the $GaInO_3$ phase so they remain after sputter deposition and easily generate nodules. In addition, the oxide semiconductor thin film formed through sputter deposition by using the oxide sintered body in which these phases are generated tends to have lower carrier mobility.

Gallium and the positive divalent element M are dissolved in the $In_2O_3$ phase. In addition, gallium makes up the $GaInO_3$ phase or the $(Ga, In)_2O_3$ phase. In the case of being dissolved in the $In_2O_3$ phase, gallium and the positive divalent element M substitute for indium, which is a trivalent cation, at the lattice positions. It is not preferred that gallium is not dissolved in the $In_2O_3$ phase but forms a $Ga_2O_3$ phase having a $\beta$-$Ga_2O_3$-type structure because of unsuccessful sintering or the like. Since the $Ga_2O_3$ phase has low conductivity, abnormal discharge arises.

It is preferred that the oxide sintered body of the present invention includes only a $GaInO_3$ phase having a $\beta$-$Ga_2O_3$-type structure or a $GaInO_3$ phase having a $\beta$-$Ga_2O_3$-type structure and a $(Ga, In)_2O_3$ phase in a range in which the X-ray diffraction peak intensity ratio defined by formula 1 below is 29% or more and 75% or less other than the $In_2O_3$ phase having a bixbyite-type structure.

$$100 \times I[GaInO_3 \text{ phase}(111)]/\{I[In_2O_3 \text{ phase}(400)]+I[GaInO_3 \text{ phase}(111)]\}[\%] \quad \text{Formula 1}$$

(wherein $I[In_2O_3$ phase (400)] represents a (400) peak intensity of the $In_2O_3$ phase having a bixbyite-type structure, and $I[GaInO_3$ phase (111)] represents a (111) peak intensity of the complex oxide $\beta$-$GaInO_3$ phase having a $\beta$-$Ga_2O_3$-type structure.)

2. Method for Producing Oxide Sintered Body

The oxide sintered body of the present invention uses an oxide powder consisting of an indium oxide powder and a gallium oxide powder and the oxide powder of a positive divalent element M as raw material powders.

In the process for producing the oxide sintered body of the present invention, these raw material powders are mixed and then compacted, and the compact is sintered by ordinary-pressure sintering. The formed phases in the structure of the oxide sintered body of the present invention strongly depend on the conditions in each step for producing the oxide sintered body, for example, the particle size of the raw material powders, the mixing conditions, and the sintering conditions.

The structure of the oxide sintered body of the present invention is preferably composed of an $In_2O_3$ phase having a bixbyite-type structure; and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase in a desired ratio. For this, the mean particle size of each raw material powder is preferably 3 μm or less and more preferably 1.5 μm or less. As described above, in addition to the $In_2O_3$ phase the oxide sintered body includes the $GaInO_3$ phase having a $\beta$-$Ga_2O_3$-type structure or both the $GaInO_3$ phase having a $\beta$-$Ga_2O_3$-type structure and the $(Ga, In)_2O_3$ phase. In order to suppress excessive formation of these phases, the mean particle size of the raw material powders is preferably 1.5 μm or less.

Indium oxide powder is a raw material for ITO (indium tin oxide), and fine indium oxide powder having good sintering properties has been developed along with improvements in ITO. Since indium oxide powder has been continuously used in large quantities as a raw material for ITO, raw material powder having a mean particle size of 0.8 μm or less is available these days.

However, since the amount of gallium oxide powder or the oxide powder of the positive divalent element M used is still smaller than that of indium oxide powder used, it is difficult to obtain raw material powder having a mean particle size of 1.5 μm or less. Therefore, when only coarse gallium oxide powder is available, the powder needs to be pulverized into particles having a mean particle size of 1.5 μm or less.

In the process for sintering the oxide sintered body of the present invention, ordinary-pressure sintering is preferably employed. Ordinary-pressure sintering is a simple and industrially advantageous method, and is also an economically preferable means.

When ordinary-pressure sintering is used, a compact is first produced as described above. Raw material powders are placed in a resin pot and mixed with a binder (for example, PVA) and the like by wet ball milling or the like. In the production of the oxide sintered body of the present invention, the ball mill mixing is preferably performed for 18 hours or longer in order to suppress excessive formation of the $GaInO_3$ phase having a $\beta$-$Ga_2O_3$-type structure or both the $GaInO_3$ phase having a $\beta$-$Ga_2O_3$-type structure and the $(Ga, In)_2O_3$ phase in addition to the $In_2O_3$ phase or not to form a $Ga_2O_3$ phase having a $\beta$-$Ga_2O_3$-type structure. At this time, hard $ZrO_2$ balls may be used as mixing balls. After mixing, the slurry is taken out, filtrated, dried, and granulated. Subsequently, the resultant granulated material is compacted under a pressure of about 9.8 MPa (0.1 ton/cm$^2$) to 294 MPa (3 ton/cm$^2$) by cold isostatic pressing to form a compact.

The sintering process by ordinary-pressure sintering is preferably preformed in an atmosphere containing oxygen. The volume fraction of oxygen in the atmosphere is preferably over 20%. In particular, when the volume fraction of oxygen is over 20%, the oxide sintered body is further densified. An excessive amount of oxygen in the atmosphere causes the surface of the compact to undergo sintering in advance during the early stage of sintering. Subsequently, sintering proceeds while the inside of the compact is reduced, and a highly dense oxide sintered body is finally obtained.

In an atmosphere free of oxygen, the surface of the compact does not undergo sintering and as a result, densification of the sintered body does not proceed. If oxygen is absent, indium oxide decomposes particularly at about 900° C. to 1000° C. to form metal indium, which makes it difficult to obtain a desired oxide sintered body.

The temperature range of ordinary-pressure sintering is preferably 1200° C. or higher and 1550° C. or lower and more preferably from 1350° C. or higher and 1450° C. or lower in an atmosphere obtained by introducing oxygen gas into air in a sintering furnace. The sintering time is preferably 10 to 30 hours, and more preferably 15 to 25 hours.

When the sintering temperature is in the above range, and the oxide powder consisting of an indium oxide powder and a gallium oxide powder and an oxide powder of the positive divalent element M which are controlled to have a mean particle size of 1.5 µm or less are used as raw material powders, an oxide sintered body that is composed of an $In_2O_3$ phase having a bixbyite-type structure; and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase is obtained.

At a sintering temperature lower than 1200° C., the sintering reaction does not proceed well and the disadvantage is caused that the density of the oxide sintered body is less than 6.4 $g/cm^3$. On the other hand, the formation of the $(Ga, In)_2O_3$ phase is significant at a sintering temperature higher than 1550° C. The $(Ga, In)_2O_3$ phase causes a decrease in deposition rate since it has a higher electrical resistance value than the $GaInO_3$ phase. At a sintering temperature of 1550° C. or lower, only a small amount of the $(Ga, In)_2O_3$ phase is produce, which is acceptable. From this point of view, the sintering temperature is preferably 1200° C. or higher and 1550° C. or lower and more preferably from 1350° C. or higher and 1450° C. or lower.

The temperature elevation rate until the sintering temperature is reached is preferably in the range of 0.2 to 5° C./min in order to cause debinding without forming cracks in the sintered body. As long as the temperature elevation rate is this range, the temperature may be increased to the sintering temperature in a combination of different temperature elevation rates as desired. During the temperature elevation process, a particular temperature may be maintained for a certain time in order for debinding and sintering to proceed. Particularly in the case of using a lead oxide powder as a raw material powder, it is effective to hold the oxide sintered body at a temperature of 1100° C. or lower for a certain time in order to promote the dissolution of the lead element into the $In_2O_3$ phase. The holding time is not particularly limited, but is preferably 1 hour or longer and 10 hours or shorter. After sintering, oxygen introduction is stopped before cooling. The temperature is preferably decreased to 1000° C. at a temperature drop rate in the range of preferably 0.2 to 5° C./min, and particularly 0.2° C./min or more and less than 1° C./min.

3. Target

The target of the present invention can be obtained by machining the oxide sintered body to a predetermined size, grinding the surface thereof and bonding the oxide sintered body to a backing plate. The target preferably has a flat shape, but may have a cylindrical shape. When a cylindrical target is used, it is preferred to suppress particle generation due to target rotation.

In order to be used as a sputtering target, the density of the oxide sintered body of the present invention is preferably 6.3 $g/cm^3$ or more. It is not preferred that the density is less than 6.3 $g/cm^3$ since nodules are generated when being used in mass production.

4. Oxide Semiconductor Thin Film and Method for Depositing Oxide Semiconductor Thin Film The amorphous oxide semiconductor thin film of the present invention is obtained as follows: once forming an amorphous thin film on a substrate by sputtering using the sputtering target; and subjecting the amorphous thin film to heat treatment.

The sputtering target is formed from the oxide sintered body. The structure of the oxide sintered body, namely, the structure that is basically composed of an $In_2O_3$ phase having a bixbyite-type structure and a $GaInO_3$ phase having a $\beta$-$Ga_2O_3$-type structure, is important. To obtain the amorphous oxide semiconductor thin film according to the present invention, it is important that the amorphous oxide thin film has a high crystallization temperature. The crystallization temperature is related to the structure of the oxide sintered body. That is, when the oxide sintered body not only includes an $In_2O_3$ phase having a bixbyite-type structure but also a $GaInO_3$ phase having a $\beta$-$Ga_2O_3$-type structure as in the oxide sintered body used in the present invention, the oxide thin film obtained from this oxide sintered body through film deposition has a high crystallization temperature, namely, a crystallization temperature of preferably 250° C. or higher, more preferably 300° C. or higher, and even more preferably 350° C. or higher. That is, the oxide semiconductor thin film is a stable amorphous film. In contrast, when the oxide sintered body includes only an $In_2O_3$ phase having a bixbyite-type structure, the oxide thin film after the film deposition has a low crystallization temperature of about 190 to 230° C. and is not completely amorphous in some cases. Therefore, a heat treatment at about 250° C. causes crystallization in some cases. Incidentally, in this case, microcrystals are already generated after film deposition, and the oxide sintered body is no longer amorphous, which makes wet-etching patterning difficult. This fact is well known for ordinary ITO (tin-doped indium oxide) transparent conducting films.

Ordinary sputtering is used in the process for forming the amorphous thin film, but in particular, direct current (DC) sputtering is industrially advantageous because the thermal effects are minimized during film deposition and high-rate deposition is achieved. To form the oxide semiconductor thin film of the present invention by direct current sputtering, a gas mixture of an inert gas and oxygen, particularly argon and oxygen, is preferably used as a sputtering gas. Sputtering is preferably performed in a chamber of a sputtering apparatus at an internal pressure of 0.1 to 1 Pa, particularly 0.2 to 0.8 Pa.

The substrate is typically a glass substrate and is preferably an alkali-free glass substrate. In addition, any resin sheet and resin film that withstands the above process temperature can be used.

In the process for forming the amorphous thin film, presputtering can be performed as follows: for example, after evacuation to $1\times10^4$ Pa or less, introducing a gas mixture of argon and oxygen until the gas pressure reaches 0.2 to 0.5 Pa; and generating a direct current plasma by applying direct current power so that the direct current power with respect to the area of the target, namely, the direct current power density, is in the range of about 1 to 7 W/cm². It is preferred that, after this presputtering for 5 to 30 minutes, the substrate position be corrected as desired and then sputtering be performed. In sputter deposition, the direct current power applied is increased in the acceptable range in order to increase the deposition rate.

The amorphous oxide semiconductor thin film according to the present invention is obtained by forming the amorphous thin film and then subjecting this to a heat treatment. The condition for heat treatment is a temperature lower than the crystallization temperature in an oxidizing atmosphere. The oxidizing atmosphere is preferably an atmosphere containing oxygen, ozone, water vapor, or nitrogen oxides. The temperature for heat treatment is preferably 250 to 600° C., more preferably 300 to 550° C., and even more preferably 350 to 500° C. The time for heat treatment, i.e., the time during which the amorphous thin film is held at the heat treatment temperature, is preferably 1 to 120 minutes and more preferably 5 to 60 minutes. In an example method until the heat treatment, an amorphous film is formed at a low temperature, for example, near room temperature, and a heat treatment is then performed at a temperature lower than the crystallization temperature to obtain an amorphous oxide semiconductor thin film. In another method, the substrate is heated to a temperature lower than the crystallization temperature of an oxide thin film, preferably to between 100 and 300° C., and an amorphous oxide semiconductor thin film is deposited. Subsequently, a heat treatment may be further performed.

The proportion of indium, gallium, and the positive divalent element M in the thin film before the heat treatment and the amorphous oxide semiconductor thin film after the heat treatment substantially corresponds to the composition of the oxide sintered body of the present invention. That is, the amorphous oxide semiconductor thin film contains indium and gallium as oxides and further contains the positive divalent element M. The gallium content is 0.20 or more and 0.45 or less in terms of Ga/(In+Ga) atomic ratio. The content of the positive divalent element M is 0.0001 or more and 0.05 or less in terms of M/(In+Ga+M) atomic ratio. The gallium content is more preferably 0.20 or more and 0.30 or less and even more preferably 0.25 or more and 0.30 or less in terms of Ga/(In+Ga) atomic ratio. In addition, the content of the positive divalent element M is more preferably 0.01 or more and 0.03 or less in terms of M/(In+Ga+M) atomic ratio.

The amorphous oxide semiconductor thin film of the present invention is obtained by film deposition using, as a sputtering target or the like, an oxide sintered body having the composition and structure controlled as described above, followed by a heat treatment under the above appropriate conditions. Through this process, the carrier density decreases to $3.0 \times 10^{18}$ cm$^{-3}$ or less, more preferably the carrier density decreases to $1.0 \times 10^{18}$ cm$^{-3}$ or less, particularly preferably to $8.0 \times 10^{17}$ cm$^{-3}$ or less. As represented by an amorphous oxide semiconductor thin film that is composed of indium, gallium, and zinc and described in Non-Patent Document 1, an amorphous oxide semiconductor thin film containing indium in a great amount is in a degenerate state when the carrier density is $4 \times 10^{18}$ cm$^{-3}$ or more. A TFT including such an amorphous oxide semiconductor thin film as a channel layer thus does not exhibit normally-off characteristics. Therefore, the amorphous oxide semiconductor thin film according to the present invention is advantageous in that the carrier density is controlled so that the TFT exhibits normally-off characteristics. In addition, the carrier mobility is 10 cm² V$^{-1}$ sec$^{-1}$ or more and more preferably 15 cm² V$^{-1}$ sec$^{-1}$ or more.

The amorphous oxide semiconductor thin film of the present invention is subjected to micromachining, which is required in applications such as TFTs, by wet etching or dry etching. In general, an amorphous oxide thin film may be first formed at an appropriate substrate temperature selected from temperatures lower than the crystallization temperature, for example, temperatures from room temperature to 300° C., and then the amorphous oxide thin film may be micromachined by wet etching. Most weak acids can be used as an etchant, but a weak acid composed mainly of oxalic acid is preferably used. For example, commercial products, such as ITO-06N available from Kanto Chemical Co., Inc., can be used. Dry etching may be selected depending on the configuration of TFTs.

Although the thickness of the amorphous oxide semiconductor thin film of the present invention is not limited, the thickness is 10 to 500 nm, preferably 20 to 300 nm, and more preferably 30 to 100 nm. When the thickness is less than 10 nm, high carrier mobility is not achieved. When the film thickness is more than 500 nm, it is disadvantageous in that a problem associated with productivity arises.

In addition, the amorphous oxide semiconductor thin film of the present invention has an average transmittance in the visible region (400 to 800 nm) of preferably 80% or more, more preferably 85% or more, and even more preferably 90% or more. When applying the crystalline oxide semiconductor thin film to a transparent TFT, the light extraction efficiency by a liquid crystal element, an organic EL element, and the like as a transparent display device decreases when the average transmittance is less than 80%.

EXAMPLES

A more detailed description is provided below by way of Examples of the present invention, but the present invention is not limited by these Examples.

<Evaluation of Oxide Sintered Body>

The composition of the metal elements in the obtained oxide sintered body was determined by ICP emission spectroscopy. The formed phases were identified by a powder method with an X-ray diffractometer (available from Philips) using rejects of the obtained oxide sintered body.

<Evaluation of Basic Properties of Oxide Thin Film>

The composition of the obtained oxide thin film was determined by ICP emission spectrometry. The thickness of the oxide thin film was determined with a surface profilometer (available from KLA-Tencor Corporation). The deposition rate was calculated from the film thickness and the film deposition time. The carrier density and mobility of the oxide thin film were determined with a Hall-effect measurement apparatus (available from TOYO Corporation). The formed phases in the film were identified by X-ray diffraction measurement.

1. Case of Using Ni as Positive Divalent Element M (Production and evaluation of sintered body)

An indium oxide powder, a gallium oxide powder, and a nickel oxide powder as a positive divalent element M were prepared as raw material powders so that each powder has a mean particle size of 1.5 μm or less. These raw material powders were prepared so as to obtain the Ga/(In+Ga) atomic ratio and the M/(In+Ga+M) atomic ratio of Examples and Comparative Examples shown in Table 1. The raw material powders were placed in a resin pot together with water and mixed by wet ball milling. In this case, hard $ZrO_2$ balls were used, and the mixing time was 18 hours. After mixing, the slurry was taken out, filtered, dried, and granulated. The granulated material was compacted by cold isostatic pressing under a pressure of 3 ton/cm².

Next, the compact was sintered as described below. The compact was sintered at a sintering temperature of between 1000 and 1550° C. for 20 hours in an atmosphere obtained by introducing oxygen into air in a sintering furnace at a rate of 5 L/min per 0.1 m³ furnace volume. At this time, the temperature was increased by 1° C./min, oxygen introduction was stopped during cooling after sintering, and the temperature was decreased to 1000° C. by 10° C./min.

The composition of the obtained oxide sintered body was analyzed by ICP emission spectrometry. As a result, it was confirmed that the proportion of the metal elements was substantially the same as the composition prepared at the time of mixing raw material powders in all Examples.

Next, the phase identification of the oxide sintered body was performed by X-ray diffraction measurement, as in Table 1, only the diffraction peak attributed to the $In_2O_3$ phase having a bixbyite-type structure or only the diffraction peaks attributed to the $In_2O_3$ phase having a bixbyite-type structure and the $GaInO_3$ phase having a $\beta$-$Ga_2O_3$-type structure and the $(Ga, In)_2O_3$ phase were confirmed.

When the oxide sintered body includes a $GaInO_3$ phase having a $\beta$-$Ga_2O_3$-type structure, the X-ray diffraction peak intensity ratio of the $GaInO_3$ phase having a $\beta$-$Ga_2O_3$-type structure defined by formula 1 below is shown in Table 1.

$$100 \times I[GaInO_3 \text{ phase}(111)]/\{I[In_2O_3 \text{ phase}(400)]+I[GaInO_3 \text{ phase}(111)]\}[\%] \quad \text{Formula 1}$$

TABLE 1

|  | Ga/(In + Ga) Atomic ratio | Ni/(In + Ga + Ni) Atomic ratio | Sintering temperature (° C.) | Density of sintered body (g/cm³) | GaInO₃ (111) Peak intensity ratio | Structure of sintered body |
| --- | --- | --- | --- | --- | --- | --- |
| Comparative Example 1 | 0.15 | 0.03 | 1400 | 6.90 | 28 | In₂O₃/GaInO₃ |
| Example 1 | 0.20 | 0.0001 | 1400 | 6.87 | 32 | In₂O₃/GaInO₃ |
| Example 2 | 0.20 | 0.01 | 1400 | 6.86 | 33 | In₂O₃/GaInO₃ |
| Example 3 | 0.20 | 0.01 | 1550 | 6.79 | 30 | In₂O₃/GaInO₃/(Ga,In)₂O₃ |
| Example 4 | 0.20 | 0.03 | 1400 | 6.84 | 36 | In₂O₃/GaInO₃ |
| Example 5 | 0.20 | 0.05 | 1400 | 6.81 | 38 | In₂O₃/GaInO₃ |
| Comparative Example 2 | 0.20 | 0.10 | 1400 | 6.19 | — | In₂O₃/NiGa₂O₄/NiInGaO₄ |
| Example 6 | 0.25 | 0.01 | 1400 | 6.81 | 45 | In₂O₃/GaInO₃ |
| Example 7 | 0.30 | 0.01 | 1400 | 6.71 | 52 | In₂O₃/GaInO₃ |
| Example 8 | 0.45 | 0.0001 | 1400 | 6.49 | 73 | In₂O₃/GaInO₃ |
| Example 9 | 0.45 | 0.001 | 1400 | 6.48 | 75 | In₂O₃/GaInO₃ |
| Example 10 | 0.45 | 0.01 | 1400 | 6.46 | 73 | In₂O₃/GaInO₃ |
| Example 11 | 0.45 | 0.03 | 1450 | 6.46 | 73 | In₂O₃/GaInO₃ |
| Example 12 | 0.45 | 0.05 | 1400 | 6.42 | 71 | In₂O₃/GaInO₃ |
| Comparative Example 3 | 0.45 | 0.10 | 1400 | 6.19 | — | In₂O₃/NiGa₂O₄/NiInGaO₄ |
| Comparative Example 4 | 0.65 | 0.05 | 1400 | 6.02 | — | GaInO₃/NiInGaO₄/Ga₂O₃ |

(the positive divalent element is Ni)

The oxide sintered body was machined to a size of 152 mm in diameter and 5 mm in thickness. The sputtering surface was grinded with a cup grinding wheel so that the maximum height Rz was 3.0 μm or less. The machined oxide sintered body was bonded to an oxygen-free copper backing plate by using metal indium to provide a sputtering target.

2. Case of Using Co, Ca, Sr, and Pb as Positive Divalent Element M

The oxide sintered body was produced in the same manner as in the case in which the positive divalent element M was Ni except that cobalt(II) oxide, calcium(II) oxide, strontium(II) oxide, and lead(II) oxide were used as the positive divalent element M, the composition was analyzed, the phases were identified, and the X-ray diffraction peak intensity ratio of the $GaInO_3$ phase having a $\beta$-$Ga_2O_3$-type structure was thus calculated. The results are shown in Table 2 for the case of using cobalt(II) oxide, Table 3 for the case of using calcium(II) oxide, Table 4 for the case of using lead(II) oxide, and Table 5 for the case of using strontium(II) oxide. Incidentally, in the composition analysis, it was confirmed that the proportion of the metal elements was substantially the same as the composition prepared at the time of mixing raw material powders in all Examples.

TABLE 2

|  | Ga/(In + Ga) Atomic ratio | Co/(In + Ga + Co) Atomic ratio | Sintering temperature (° C.) | Density of sintered body (g/cm³) | GaInO₃ (111) Peak intensity ratio | Structure of sintered body |
| --- | --- | --- | --- | --- | --- | --- |
| Comparative Example 5 | 0.15 | 0.03 | 1400 | 6.91 | 27 | In₂O₃/GaInO₃ |
| Example 13 | 0.20 | 0.0001 | 1400 | 6.83 | 32 | In₂O₃/GaInO₃ |
| Example 14 | 0.20 | 0.03 | 1400 | 6.72 | 40 | In₂O₃/GaInO₃ |
| Example 15 | 0.30 | 0.03 | 1400 | 6.64 | 55 | In₂O₃/GaInO₃ |
| Example 16 | 0.45 | 0.0001 | 1400 | 6.42 | 75 | In₂O₃/GaInO₃ |
| Example 17 | 0.45 | 0.05 | 1400 | 6.33 | 72 | In₂O₃/GaInO₃ |
| Comparative Example 6 | 0.45 | 0.10 | 1400 | 6.10 | — | In₂O₃/GaInO₃/CoGa₂O₄ |
| Comparative Example 7 | 0.65 | 0.05 | 1400 | 6.00 | — | GaInO₃/CoGa₂O₄/Ga₂O₃ |

(the positive divalent element is Co)

TABLE 3

|  | Ga/(In + Ga) Atomic ratio | Ca/(In + Ga + Ca) Atomic ratio | Sintering temperature (° C.) | Density of sintered body (g/cm³) | GaInO₃ (111) Peak intensity ratio | Structure of sintered body |
| --- | --- | --- | --- | --- | --- | --- |
| Comparative Example 8 | 0.15 | 0.03 | 1400 | 6.88 | 25 | In₂O₃/GaInO₃ |
| Example 18 | 0.20 | 0.0001 | 1400 | 6.82 | 31 | In₂O₃/GaInO₃ |
| Example 19 | 0.20 | 0.03 | 1400 | 6.69 | 39 | In₂O₃/GaInO₃ |
| Example 20 | 0.45 | 0.0001 | 1400 | 6.41 | 75 | In₂O₃/GaInO₃ |
| Example 21 | 0.45 | 0.05 | 1400 | 6.33 | 74 | In₂O₃/GaInO₃ |
| Comparative Example 9 | 0.45 | 0.10 | 1400 | 6.09 | — | In₂O₃/GaInO₃/CaGa₄O₂ |
| Comparative Example 10 | 0.65 | 0.05 | 1400 | 5.98 | — | GaInO₃/CaGa₄O₇/Ga₂O₃ |

(the positive divalent element is Ca)

TABLE 4

|  | Ga/(In + Ga) Atomic ratio | Sr/(In + Ga + Sr) Atomic ratio | Sintering temperature (° C.) | Density of sintered body (g/cm³) | GaInO₃ (111) Peak intensity ratio | Structure of sintered body |
| --- | --- | --- | --- | --- | --- | --- |
| Comparative Example 11 | 0.15 | 0.03 | 1400 | 6.89 | 26 | In₂O₃/GaInO₃ |
| Example 22 | 0.20 | 0.0001 | 1400 | 6.78 | 32 | In₂O₃/GaInO₃ |
| Example 23 | 0.20 | 0.03 | 1400 | 6.64 | 38 | In₂O₃/GaInO₃ |
| Example 24 | 0.45 | 0.0001 | 1400 | 6.37 | 75 | In₂O₃/GaInO₃ |
| Example 25 | 0.45 | 0.05 | 1400 | 6.30 | 74 | In₂O₃/GaInO₃ |
| Comparative Example 12 | 0.45 | 0.10 | 1400 | 6.07 | — | In₂O₃/GaInO₃/SrGa₂O₄ |
| Comparative Example 13 | 0.65 | 0.05 | 1400 | 5.97 | — | GaInO₃/SrGa₂O₄/Ga₂O₃ |

(the positive divalent element is Sr)

TABLE 5

|  | Ga/(In + Ga) Atomic ratio | Pb/(In + Ga + Pb) Atomic ratio | Sintering temperature (° C.) | Density of sintered body (g/cm³) | GaInO₃ (111) Peak intensity ratio | Structure of sintered body |
| --- | --- | --- | --- | --- | --- | --- |
| Comparative Example 14 | 0.15 | 0.03 | 1400 | 6.92 | 25 | In₂O₃/GaInO₃ |
| Example 26 | 0.20 | 0.0001 | 1400 | 6.86 | 29 | In₂O₃/GaInO₃ |
| Example 27 | 0.20 | 0.03 | 1400 | 6.88 | 31 | In₂O₃/GaInO₃ |
| Example 28 | 0.45 | 0.0001 | 1400 | 6.47 | 75 | In₂O₃/GaInO₃ |
| Example 29 | 0.45 | 0.05 | 1400 | 6.51 | 68 | In₂O₃/GaInO₃ |

TABLE 5-continued

|  | Ga/(In + Ga) Atomic ratio | Pb/(In + Ga + Pb) Atomic ratio | Sintering temperature (° C.) | Density of sintered body (g/cm³) | GaInO₃ (111) Peak intensity ratio | Structure of sintered body |
|---|---|---|---|---|---|---|
| Comparative Example 15 | 0.45 | 0.10 | 1400 | 6.27 | — | In₂O₃/GaInO₃/Ga₂PbO₄ |
| Comparative Example 16 | 0.65 | 0.05 | 1400 | 6.05 | — | GaInO₃/Ga₂PbO₄/Ga₂O₃ |

(the positive divalent element is Pb)

(Evaluation on Sputter Deposition)

Film deposition by direct current sputtering was performed at a substrate temperature of 200° C. in the respective Examples and Comparative Examples. The sputtering target was attached to a cathode of a direct current magnetron sputtering apparatus (available from Tokki Corporation) having a direct current power supply with no arcing control function. At this time, the target-substrate (holder) distance was fixed at 60 mm. After evacuation to $1 \times 10^{-4}$ Pa or less, a gas mixture of argon and oxygen was introduced at an appropriate oxygen ratio, which depends on the gallium content in each target. The gas pressure was controlled to 0.6 Pa. A direct current plasma was generated by applying a direct current power of 300 W (1.64 W/cm²). After presputtering for 10 minutes, the substrate was placed directly above the sputtering target, namely, in the stationary opposing position, and an oxide thin film having a thickness of 50 nm was deposited. The composition of the obtained oxide thin film was confirmed to be substantially the same as that of the target. In addition, the oxide thin film was confirmed to be amorphous as a result of the X-ray diffraction measurement. The obtained amorphous oxide thin film was subjected to heat treatment at 250 to 600° C. for 30 minutes in an oxidizing atmosphere by using an RTA (Rapid Thermal Annealing) apparatus. The oxide thin film after the heat treatment was confirmed to be amorphous from the results of X-ray diffraction measurement. The Hall-effect measurement was performed on the amorphous oxide semiconductor thin films thus obtained to determine the carrier density and the carrier mobility. The obtained evaluation results are summarized in Table 6 to Table 10.

TABLE 6

|  | Ga/(In + Ga) Atomic ratio | Ni/(In + Ga + Ni) Atomic ratio | Sintering temperature (° C.) | Heat treatment temperature (° C.) | Film thickness (nm) | Crystal structure of thin film | Carrier density (×10¹⁷ cm⁻³) | Carrier mobility (cm²/V · s) |
|---|---|---|---|---|---|---|---|---|
| Comparative Example 1 | 0.15 | 0.03 | 1400 | 250 | 50 | Amorphous | 46 | 27.1 |
| Example 1 | 0.20 | 0.0001 | 1400 | 350 | 50 | Amorphous | 25 | 25.9 |
| Example 2 | 0.20 | 0.01 | 1400 | 350 | 50 | Amorphous | 9.2 | 24.1 |
| Example 3 | 0.20 | 0.01 | 1550 | 350 | 50 | Amorphous | 11 | 22.7 |
| Example 4 | 0.20 | 0.03 | 1400 | 350 | 50 | Amorphous | 6.5 | 22.1 |
| Example 5 | 0.20 | 0.05 | 1400 | 350 | 50 | Amorphous | 4.3 | 20.6 |
| Comparative Example 2 | 0.20 | 0.10 | 1400 | 350 | 50 | Amorphous | 4.8 | 14.6 |
| Example 6 | 0.25 | 0.01 | 1400 | 350 | 50 | Amorphous | 4.4 | 21.6 |
| Example 7 | 0.30 | 0.01 | 1400 | 350 | 50 | Amorphous | 3.1 | 20.8 |
| Example 8 | 0.45 | 0.0001 | 1400 | 400 | 50 | Amorphous | 0.45 | 14.1 |
| Example 9 | 0.45 | 0.001 | 1400 | 400 | 50 | Amorphous | 0.41 | 14.0 |
| Example 10 | 0.45 | 0.01 | 1400 | 400 | 50 | Amorphous | 0.34 | 13.0 |
| Example 11 | 0.45 | 0.03 | 1450 | 400 | 50 | Amorphous | 0.21 | 11.9 |
| Example 12 | 0.45 | 0.05 | 1400 | 400 | 50 | Amorphous | 0.15 | 11.1 |
| Comparative Example 3 | 0.45 | 0.10 | 1400 | 400 | 50 | Amorphous | Unmeasurable | Unmeasurable |
| Comparative Example 4 | 0.65 | 0.05 | 1400 | 400 | — | — | Unable to deposit film | Unable to deposit film |

(the positive divalent element is Ni)

TABLE 7

|  | Ga/(In + Ga) Atomic ratio | Co/(In + Ga + Co) Atomic ratio | Sintering temperature (° C.) | Heat treatment temperature (° C.) | Film thickness (nm) | Crystal structure of thin film | Carrier density (×10¹⁷ cm⁻³) | Carrier mobility (cm²/V · s) |
|---|---|---|---|---|---|---|---|---|
| Comparative Example 5 | 0.15 | 0.03 | 1400 | 250 | 50 | Amorphous | 42 | 26.4 |
| Example 13 | 0.20 | 0.0001 | 1400 | 350 | 50 | Amorphous | 23 | 25.2 |
| Example 14 | 0.20 | 0.03 | 1400 | 350 | 50 | Amorphous | 5.8 | 21.5 |
| Example 15 | 0.30 | 0.01 | 1400 | 350 | 50 | Amorphous | 2.6 | 20.5 |

TABLE 7-continued

|  | Ga/(In + Ga) Atomic ratio | Co/(In + Ga + Co) Atomic ratio | Sintering temperature (° C.) | Heat treatment temperature (° C.) | Film thickness (nm) | Crystal structure of thin film | Carrier density (×10$^{17}$ cm$^{-3}$) | Carrier mobility (cm$^2$/V · s) |
|---|---|---|---|---|---|---|---|---|
| Example 16 | 0.45 | 0.0001 | 1400 | 400 | 50 | Amorphous | 0.37 | 13.4 |
| Example 17 | 0.45 | 0.05 | 1400 | 400 | 50 | Amorphous | 0.12 | 10.8 |
| Comparative Example 6 | 0.45 | 0.10 | 1400 | 400 | 50 | Amorphous | Unmeasurable | Unmeasurable |
| Comparative Example 7 | 0.65 | 0.05 | 1400 | 400 | — | — | Unable to deposit film | Unable to deposit film |

(the positive divalent element is Co)

TABLE 8

|  | Ga/(In + Ga) Atomic ratio | Ca/(In + Ga + Ca) Atomic ratio | Sintering temperature (° C.) | Heat treatment temperature (° C.) | Film thickness (nm) | Crystal structure of thin film | Carrier density (×10$^{17}$ cm$^{-3}$) | Carrier mobility (cm$^2$/V · s) |
|---|---|---|---|---|---|---|---|---|
| Comparative Example 8 | 0.15 | 0.03 | 1400 | 250 | 50 | Amorphous | 51 | 24.9 |
| Example 18 | 0.20 | 0.0001 | 1400 | 350 | 50 | Amorphous | 24 | 23.8 |
| Example 19 | 0.20 | 0.03 | 1400 | 350 | 50 | Amorphous | 5.6 | 20.8 |
| Example 20 | 0.45 | 0.01 | 1400 | 400 | 50 | Amorphous | 0.41 | 12.8 |
| Example 21 | 0.45 | 0.05 | 1400 | 400 | 50 | Amorphous | 0.13 | 10.5 |
| Comparative Example 9 | 0.45 | 0.10 | 1400 | 400 | 50 | Amorphous | Unmeasurable | Unmeasurable |
| Comparative Example 10 | 0.65 | 0.05 | 1400 | 400 | — | — | Unable to deposit film | Unable to deposit film |

(the positive divalent element is Ca)

TABLE 9

|  | Ga/(In + Ga) Atomic ratio | Sr/(In + Ga + Sr) Atomic ratio | Sintering temperature (° C.) | Heat treatment temperature (° C.) | Film thickness (nm) | Crystal structure of thin film | Carrier density (×10$^{17}$ cm$^{-3}$) | Carrier mobility (cm$^2$/V · s) |
|---|---|---|---|---|---|---|---|---|
| Comparative Example 11 | 0.15 | 0.03 | 1400 | 250 | 50 | Amorphous | 54 | 23.5 |
| Example 22 | 0.20 | 0.0001 | 1400 | 350 | 50 | Amorphous | 26 | 22.3 |
| Example 23 | 0.20 | 0.03 | 1400 | 350 | 50 | Amorphous | 7.6 | 20.4 |
| Example 24 | 0.45 | 0.01 | 1400 | 400 | 50 | Amorphous | 0.55 | 11.9 |
| Example 25 | 0.45 | 0.05 | 1400 | 400 | 50 | Amorphous | 0.21 | 10.1 |
| Comparative Example 12 | 0.45 | 0.10 | 1400 | 400 | 50 | Amorphous | Unmeasurable | Unmeasurable |
| Comparative Example 13 | 0.65 | 0.05 | 1400 | 400 | — | — | Unable to deposit film | Unable to deposit film |

(the positive divalent element is Sr)

TABLE 10

|  | Ga/(In + Ga) Atomic ratio | Pb/(In + Ga + Pb) Atomic ratio | Sintering temperature (° C.) | Heat treatment temperature (° C.) | Film thickness (nm) | Crystal structure of thin film | Carrier density (×10$^{17}$ cm$^{-3}$) | Carrier mobility (cm$^2$/V · s) |
|---|---|---|---|---|---|---|---|---|
| Comparative Example 14 | 0.15 | 0.03 | 1400 | 250 | 50 | Amorphous | 52 | 27.8 |
| Example 26 | 0.20 | 0.0001 | 1400 | 350 | 50 | Amorphous | 27 | 26.4 |
| Example 27 | 0.20 | 0.03 | 1400 | 350 | 50 | Amorphous | 7.3 | 23.4 |
| Example 28 | 0.45 | 0.01 | 1400 | 400 | 50 | Amorphous | 0.55 | 14.7 |
| Example 29 | 0.45 | 0.05 | 1400 | 400 | 50 | Amorphous | 0.26 | 12.6 |

TABLE 10-continued

|  | Ga/<br>(In + Ga)<br>Atomic<br>ratio | Pb/<br>(In + Ga + Pb)<br>Atomic ratio | Sintering<br>temperature<br>(° C.) | Heat<br>treatment<br>temperature<br>(° C.) | Film<br>thickness<br>(nm) | Crystal<br>structure<br>of<br>thin<br>film | Carrier<br>density<br>(×10$^{17}$ cm$^{-3}$) | Carrier<br>mobility<br>(cm$^2$/V · s) |
|---|---|---|---|---|---|---|---|---|
| Comparative<br>Example 15 | 0.45 | 0.10 | 1400 | 400 | 50 | Amorphous | Unmeasurable | Unmeasurable |
| Comparative<br>Example 16 | 0.65 | 0.05 | 1400 | 400 | — | — | Unable to<br>deposit film | Unable to<br>deposit<br>film |

(the positive divalent element is Pb)

(Evaluation on Nodule Generation)

The evaluation on nodule generation was carried out by mass production-simulated sputter deposition for sputtering targets of Examples 2, 10, and 14 and Comparative Examples 3 and 6. A load-lock-system pass-type magnetron sputtering device equipped with a direct current power source without an arcing suppression function (available from ULVAC Technologies, Inc.) was used as the sputtering device. A square target having a height of 5 inches and a width of 15 inches was used as the target. The sputtering chamber for the evaluation of sputter deposition was evacuated to 7×10$^{-5}$ Pa or less, a mixed gas of argon and oxygen was then introduced into the chamber so that a suitable oxygen ratio was obtained in accordance with the gallium amount in each target, and the gas pressure was adjusted to 0.6 Pa. The reason for selecting the sputtering gas having such conditions is because it is not possible to carry out fair evaluation when the degree of vacuum in the sputtering chamber exceeds 1×10$^{-4}$ Pa and the moisture pressure in the chamber is high or hydrogen gas is doped. As it is well known in ITO and the like, the crystallization temperature of the film increases when H$^+$ derived from moisture or hydrogen gas is incorporated into the film, and the film adhering to the target non-erosion portion is likely to be amorphous. As a result, the film stress decreases and thus the film is less likely to peel off the non-erosion portion and nodules are less likely to be generated. The direct current power was set to 2500 W (direct current power density: 5.17 W/cm$^2$) by taking the fact into account that the direct current power density employed in mass production is generally about 3 to 6 W/cm$^2$. As the evaluation on nodule generation, the target surface was observed after the continuous sputtering discharge of 50 kWh and the presence or absence of nodule generation was evaluated.

[Evaluation]

As shown in Table 1 to Table 5, in the case of Examples 1 to 29 in which the gallium content is 0.20 or more and 0.45 or less in terms of Ga/(In+Ga) atomic ratio and the content of the positive divalent element M is 0.0001 or more and 0.05 or less in terms of M/(In+Ga+M) atomic ratio, the oxide sintered bodies are composed of an In$_2$O$_3$ phase having a bixbyite-type structure; and a GaInO$_3$ phase having a β-Ga$_2$O$_3$-type structure as a formed phase other than the In$_2$O$_3$ phase, or a GaInO$_3$ phase having a β-Ga$_2$O$_3$-type structure and a (Ga, In)$_2$O$_3$ phase as a formed phase other than the In$_2$O$_3$ phase.

In contrast, since the oxide sintered bodies of Comparative Examples 1, 5, 8, 11, and 14 have a gallium content of less than 0.20 in terms of Ga/(In+Ga) atomic ratio, the oxide semiconductor thin films obtained from the oxide sintered bodies of Comparative Examples above have a carrier density exceeding the upper limit of the present invention in particular as described below. In addition, in the oxide sintered bodies of Comparative Examples 2, 3, 6, 9, 12, and 15, the generated phase other than the In$_2$O$_3$ phase having a bixbyite-type structure includes a NiGa$_2$O$_4$ phase, a CoGa$_2$O$_4$ phase, a CaGa$_4$O$_7$ phase, a SrGa$_2$O$_4$ phase, and a Ga PbO$_4$ phase that are a complex oxide composed of the positive divalent element M and gallium since the content of the positive divalent element M exceeds 0.05 in terms of M/(In+Ga+M) atomic ratio, and thus the intended oxide sintered body of the present invention is not obtained.

In addition, in the evaluation on nodule generation of Examples 2, 10, and 14 and Comparative Examples 3 and 6, the generation of nodules is not observed on the targets of Examples 2, 10, and 14, which are the oxide sintered body of the present invention. On the other hand, the generation of a great number of nodules is observed on the targets of Comparative Examples 3 and 6. In Comparative Examples 3 and 6, the fact that the density of the sintered body is low and a NiGa$_2$O$_4$ phase that is a complex oxide composed of the positive divalent element M and Ga and has a higher electrical resistance so as to easily remain after sputter deposition and a CoGa$_2$O$_4$ phase of a complex oxide composed of the positive divalent element M and Ga are included in the sintered bodies is considered as the factor. Therefore, arcing often occurred during sputtering discharge.

In addition, the properties of the oxide semiconductor thin film, which is an amorphous oxide semiconductor thin film containing indium, gallium, and a positive divalent element M as oxides and in which the gallium content is controlled to 0.20 or more and 0.45 or less in terms of Ga/(In+Ga) atomic ratio and the content of the positive divalent element M is controlled to 0.0001 or more and 0.05 or less in terms of M/(In+Ga+M) atomic ratio, are shown in Table 6 to Table 10.

It can be seen that the oxide semiconductor thin films of Examples have a carrier density of less than 3.0×10$^{18}$ cm$^{-3}$ and a carrier mobility of 10 cm$^2$ V$^{-1}$ sec$^{-1}$ or more.

Among them, the oxide semiconductor thin films of Examples 1 to 4, 6, 7, 13 to 15, 18, 19, 22, 23, 26, and 27 in which the gallium content is 0.20 or more and 0.30 or less in terms of Ga/(In+Ga) atomic ratio and the content of the positive divalent element M is 0.0001 or more and 0.03 or less in terms of M/(In+Ga+M) atomic ratio exhibit excellent properties so that the carrier mobility thereof is 15 cm$^2$ V$^{-1}$ sec$^{-1}$ or more.

In contrast, the oxide semiconductor thin films of Comparative Examples 4, 7, 10, 13, and 16 have a gallium content of more than 0.45 in terms of Ga/(In+Ga) atomic ratio, and it is not possible to deposit the sintered body onto a film since a great amount of a Ga$_2$O$_3$ phase is generated in the sintered body.

The invention claimed is:

1. An oxide sintered body comprising indium, gallium, and a positive divalent element as oxides, wherein
   a gallium content is 0.20 or more and 0.45 or less in terms of Ga/(In+Ga) atomic ratio,
   the total content of all positive divalent elements is 0.0001 or more and 0.05 or less in terms of M/(In+Ga+M) atomic ratio,
   the positive divalent element is one or more selected from the group consisting of nickel, cobalt, calcium, strontium, and lead,
   the oxide sintered body includes;
   an $In_2O_3$ phase having a bixbyite-type structure;
   and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga,In)_2O_3$ phase as a formed phase other than the $In_2O_3$ phase;
   and the oxide sintered body is free of a $NiGa_2O_4$ phase, a $CoGa_2O_4$ phase, a $CaGa_4O_7$ phase, a $Ca_5Ga_6O_{14}$ phase, a $SrGa_{12}O_{19}$ phase, a $SrGa_2O_4$ phase, a $Sr_3Ga_2O_6$ phase, and a $Ga_2PbO_4$ phase, which are a complex oxide composed of the positive divalent element and gallium or a complex oxide phase of these.

2. The oxide sintered body according to claim 1, wherein the total content of all the positive divalent elements is 0.0001 or more and 0.03 or less in terms of M/(In +Ga+M) atomic ratio.

3. The oxide sintered body according to claim 1, wherein the gallium content is 0.20 or more and 0.30 or less in terms of Ga/(In+Ga) atomic ratio.

4. The oxide sintered body according to claim 1, wherein a content of element M' being positive divalent elements other than the positive divalent element and positive trivalent to positive hexavalent elements other than indium and gallium is 500 ppm or less in terms of M'/(In+Ga+M') atomic ratio.

5. The oxide sintered body according to claim 1, wherein an X-ray diffraction peak intensity ratio of a $GaInO_3$ phase having a $\beta$-$Ga_2O_3$-type structure defined by formula 1 below is in a range of 29% or more and 75% or less, $100 \times I[GaInO_3 \text{ phase } (111)]/\{I[In_2O_3 \text{ phase } (400)]+I[GaInO_3 \text{ phase } (111)]\}[\%]$ (Formula I), wherein
in Formula 1, $I[In_2O_3 \text{ phase } (400)]$ represents a (400) peak intensity of the $In_2O_3$ phase having a bixbyite-type structure, and $I[GaInO_3 \text{ phase } (111)]$ represents a (111) peak intensity of the $\beta$-$GaInO_3$ phase that is a composite oxide having a $\beta$-$Ga_2O_3$-type structure.

* * * * *